(12) United States Patent
Lee et al.

(10) Patent No.: US 10,686,022 B2
(45) Date of Patent: *Jun. 16, 2020

(54) ORGANIC LIGHT EMITTING DIODE DISPLAY

(71) Applicant: LG DISPLAY CO., LTD., Seoul (KR)

(72) Inventors: Jaesung Lee, Paju-si (KR); Sejune Kim, Paju-si (KR); Joonsuk Lee, Paju-si (KR); Dohyung Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/196,452

(22) Filed: Nov. 20, 2018

(65) Prior Publication Data

US 2019/0165064 A1  May 30, 2019

(30) Foreign Application Priority Data

Nov. 24, 2017 (KR) .................. 10-2017-0158710

(51) Int. Cl.
*H01L 27/32* (2006.01)
*G09G 3/3258* (2016.01)
*H01L 51/52* (2006.01)

(52) U.S. Cl.
CPC ....... *H01L 27/3246* (2013.01); *G09G 3/3258* (2013.01); *H01L 51/5221* (2013.01); *H01L 51/5228* (2013.01); *H01L 51/5234* (2013.01); *H01L 27/322* (2013.01)

(58) Field of Classification Search
CPC ............ H01L 27/3246; H01L 51/5221; H01L 27/322; H01L 51/5234; H01L 51/5228; G09G 3/3258
See application file for complete search history.

(56) References Cited

U.S. PATENT DOCUMENTS

| 2010/0097295 A1* | 4/2010 | Kwak | .................. H01L 27/322 |
| | | | 345/32 |
| 2012/0097990 A1* | 4/2012 | Koh | .................... H01L 27/3244 |
| | | | 257/88 |
| 2014/0183479 A1* | 7/2014 | Park | ........................ H01L 51/56 |
| | | | 257/40 |
| 2014/0183501 A1* | 7/2014 | Kim | .................... H01L 27/3246 |
| | | | 257/40 |

(Continued)

*Primary Examiner* — Roberto W Flores
(74) *Attorney, Agent, or Firm* — Birch, Stewart, Kolasch & Birch, LLP

(57) ABSTRACT

An organic light emitting diode display is discussed. The organic light emitting diode display can include a first substrate and a second substrate facing the first substrate. The first substrate includes an auxiliary electrode, a bank having an opening exposing at least a portion of the auxiliary electrode, a barrier disposed on the exposed auxiliary electrode, a spacer disposed on the bank and protruding toward the second substrate, a cathode included in an organic light emitting diode and divided by the barrier, one end of the cathode directly contacting the auxiliary electrode, a contact electrode disposed on the cathode and divided by the barrier, one end of the contact electrode directly contacting the auxiliary electrode, and a protective layer interposed between the cathode and the contact electrode. The contact electrode and a power line directly contact each other.

8 Claims, 7 Drawing Sheets

(56) References Cited

U.S. PATENT DOCUMENTS

| | | | |
|---|---|---|---|
| 2014/0346459 A1* | 11/2014 | Song | H01L 51/5228 |
| | | | 257/40 |
| 2015/0014658 A1* | 1/2015 | Choung | H01L 51/5203 |
| | | | 257/40 |
| 2015/0097171 A1* | 4/2015 | Kim | H01L 27/3246 |
| | | | 257/40 |
| 2016/0013436 A1* | 1/2016 | Im | H01L 51/5206 |
| | | | 257/40 |
| 2016/0013438 A1* | 1/2016 | Im | H01L 51/5228 |
| | | | 257/40 |
| 2016/0035803 A1* | 2/2016 | Kim | H01L 27/3246 |
| | | | 257/40 |
| 2016/0149155 A1* | 5/2016 | Kim | H01L 51/5228 |
| 2016/0233458 A1* | 8/2016 | Shen | H01L 51/5228 |
| 2017/0278910 A1* | 9/2017 | Choi | H01L 27/322 |

* cited by examiner

Connection->CAT-AE-TE-EVL

ORGANIC LIGHT EMITTING DIODE DISPLAY

CROSS-REFERENCE TO RELATED APPLICATION

This application claims the priority benefit of Korean Patent Application No. 10-2017-0158710 filed on Nov. 24, 2017 in the Republic of Korea, which is incorporated herein by reference for all purposes as if fully set forth herein.

BACKGROUND OF THE INVENTION

Field of the Invention

The present disclosure relates to an organic light emitting diode display.

Discussion of the Related Art

Various display devices have replaced heavier and larger cathode ray tubes (CRTs). Examples of such display devices can include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) for converting electric energy into light energy. The OLED includes an anode, a cathode, and an organic emission layer between the anode and the cathode. The OLED display is configured such that the OLED emits light while excitons formed by combining holes from the anode and electrons from the cathode inside an emission layer fall from an excited state to a ground state, and thus displays an image.

However, a large-area OLED display cannot maintain a uniform luminance throughout the entire surface of an active area, on which an input image is displayed, and generates a luminance variation (or luminance deviation) depending on a position. More specifically, a cathode constituting an organic light emitting diode is formed to cover most of the active area, and there is a problem in that a power voltage applied to the cathode may not have a constant voltage value throughout the entire surface of the active area. For example, as a difference between a voltage value at an entrance of the cathode supplied with the power voltage and a voltage value at a position apart from the entrance of the cathode increases due to a resistance of the cathode, the luminance variation depending on the position can increase.

This issue can be more problematic in a top emission type display device. Namely, in the top emission type display device, because it is necessary to secure a transmittance of a cathode positioned at an upper layer of an organic light emitting diode, the cathode is formed of a transparent conductive material such as indium tin oxide (ITO), or an opaque conductive material with a very small thickness. In this instance, because the surface resistance of the cathode increases, a luminance variation depending on a position can remarkably increase corresponding to an increase in the surface resistance.

In order to address such a problem, a method has been proposed to prevent a voltage drop depending on a position by forming a low potential power voltage line including a low resistance material and connecting the low potential power voltage line to a cathode. In the proposed method according to a related art, because the low potential power voltage line is formed on a lower substrate including transistors, one pixel has to further include a formation area of the low potential power voltage line and a connection area of the low potential power voltage line and the cathode in addition to a thin film transistor area and a storage capacitor area. Thus, it becomes difficult to apply the related art proposed method to a high-resolution display including small-sized unit pixels.

SUMMARY OF THE INVENTION

The present disclosure provides an organic light emitting diode display capable of achieving a uniform luminance by minimizing a variation in a low potential power voltage depending on a position.

The present disclosure further provides an organic light emitting diode display and its operation method, which address the limitations and disadvantages associated with the related art.

In one aspect of the present disclosure, there is provided an organic light emitting diode display comprising a first substrate on which an organic light emitting diode is disposed, and a second substrate on which a power line supplied with a power voltage is disposed, the second substrate facing the first substrate, wherein the first substrate includes an auxiliary electrode, a bank having an opening exposing at least a portion of the auxiliary electrode, a barrier disposed on the exposed auxiliary electrode, a spacer disposed on the bank and protruding toward the second substrate, a cathode included in the organic light emitting diode and divided by the barrier, one end of the cathode directly contacting the auxiliary electrode, a contact electrode disposed on the cathode and divided by the barrier, one end of the contact electrode directly contacting the auxiliary electrode, and a protective layer interposed between the cathode and the contact electrode, wherein the contact electrode and the power line directly contact each other.

The protective layer on the cathode can expose at least a portion of one end of the cathode, and the contact electrode can directly contact the exposed portion of the cathode.

The cathode and the contact electrode can be physically spaced apart from each other with the protective layer interposed therebetween.

The organic light emitting diode display can further comprise a power electrode disposed on the first substrate and receiving the power voltage from a power generating part. The cathode directly can contact at least a portion of the power voltage. The contact electrode can directly contact at least a portion of the power electrode.

The second substrate can include color filters, and the color filters can be partitioned by the power line. Each of the first substrate and the second substrate can include an emission region, to which light from the organic light emitting diode is emitted, and a non-emission region outside the emission region. The power line can be disposed on the non-emission region.

The organic light emitting diode display can further comprise a filler layer interposed between the first substrate and the second substrate.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure. In describing various embodiments, the same components may be described in a first embodiment, and a description thereof may be omitted in other embodiments.

The terms "first", "second", etc. may be used to describe various components, but the components are not limited by such terms. The terms are used only for the purpose of distinguishing one component from other components.

Figure 1:
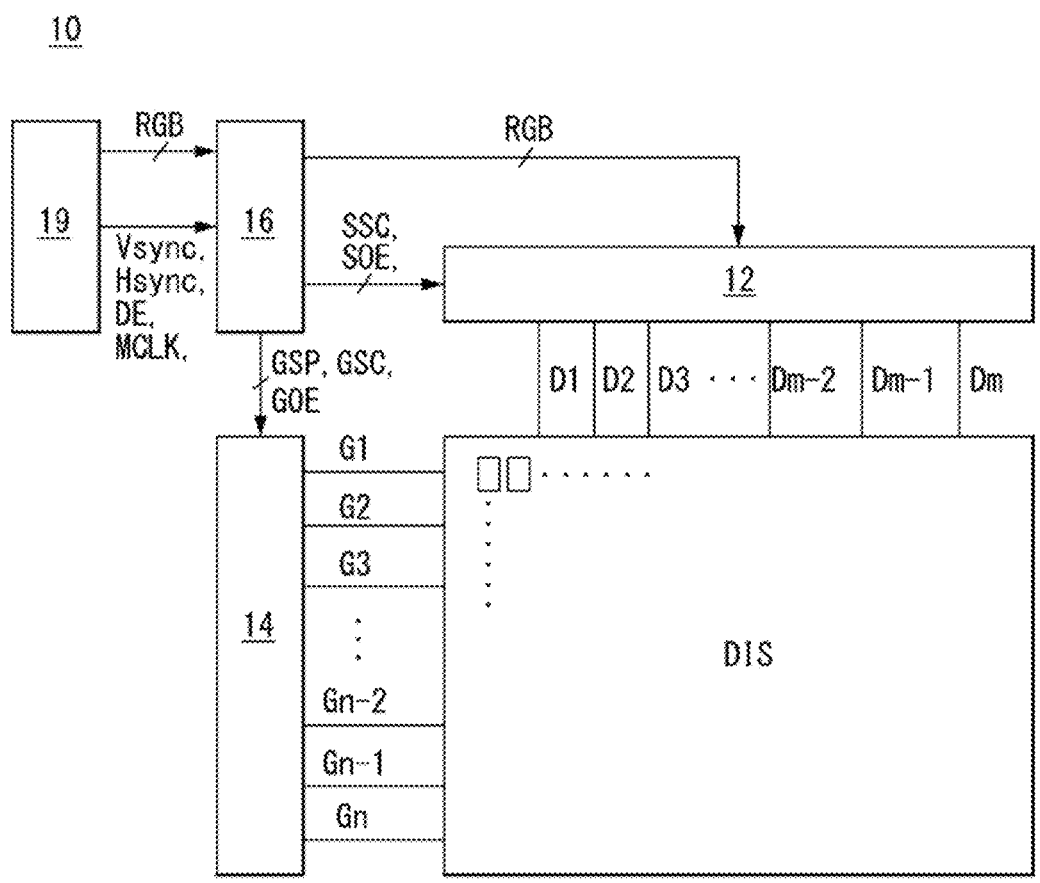
FIG. 1 is a block diagram schematically illustrating an organic light emitting diode (OLED) display according to an embodiment of the disclosure.
Figure 2:
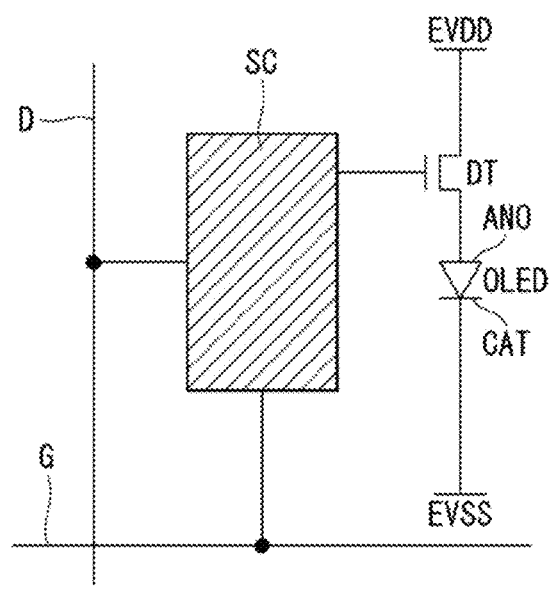
FIG. 2 schematically illustrates configuration of a pixel shown in FIG. 1.

FIG. 1 is a block diagram schematically illustrating an organic light emitting diode (OLED) display according to an embodiment of the disclosure. FIG. 2 schematically illustrates configuration of a pixel shown in FIG. 1. All the components of the OLED displays according to all embodiments of the disclosure are operatively coupled and configured.

Referring to FIG. 1, an OLED display 10 according to the embodiment of the disclosure includes a display driving circuit and a display panel DIS.

The display driving circuit includes a data driving circuit 12, a gate driving circuit 14, and a timing controller 16. The display driving circuit applies a video data voltage of an input image to pixels of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 with operation timing of the gate driving circuit 14. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 can be one of a television system, a set-top box, a navigation system, a DVD player, a Blu-ray player, a personal computer (PC), a home theater system, a phone system (e.g., a smart phone), a smart watch, and any other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS includes a pixel array. The pixel array includes the pixels defined by the data lines D1 to Dm and the gate lines G1 to Gn. Each pixel includes an organic light emitting diode serving as a self-emission element.

Referring to FIG. 2, the display panel DIS includes a plurality of data lines D, a plurality of gate lines G intersecting the data lines D, and pixels respectively arranged at intersections of the data lines D and the gate lines G in a matrix. Each pixel includes an organic light emitting diode, a driving thin film transistor (TFT) DT for controlling an amount of current flowing through the organic light emitting diode, and a programming unit SC for setting a gate-to-source voltage of the driving thin film transistor DT.

The programming unit SC can include at least one switching thin film transistor and at least one storage capacitor. The switching thin film transistor is turned on in response to a gate signal from the gate line G to thereby apply a data voltage from the data line D to one electrode of the storage capacitor. The driving thin film transistor DT controls an amount of current supplied to the organic light emitting diode depending on a magnitude of voltage stored in the storage capacitor, thereby controlling an amount of light emitted by the organic light emitting diode. The amount of light emitted by the organic light emitting diode is proportional to the amount of current supplied from the driving thin film transistor DT. The pixel is connected to a high potential power voltage source and a low potential power voltage source and receives a high potential power voltage EVDD and a low potential power voltage EVSS from a power generating part. The thin film transistors constituting the pixel can be p-type thin film transistors or n-type thin film transistors. Further, semiconductor layers of the thin film transistors constituting the pixel can include amorphous silicon, polycrystalline silicon, or oxide. In the following description, embodiments of the disclosure use a semiconductor layer including oxide as an example. The organic light emitting diode includes an anode ANO, a cathode CAT, and an organic light emitting layer between the anode ANO and the cathode CAT. The anode ANO is connected to the driving thin film transistor DT.

Figure 3:
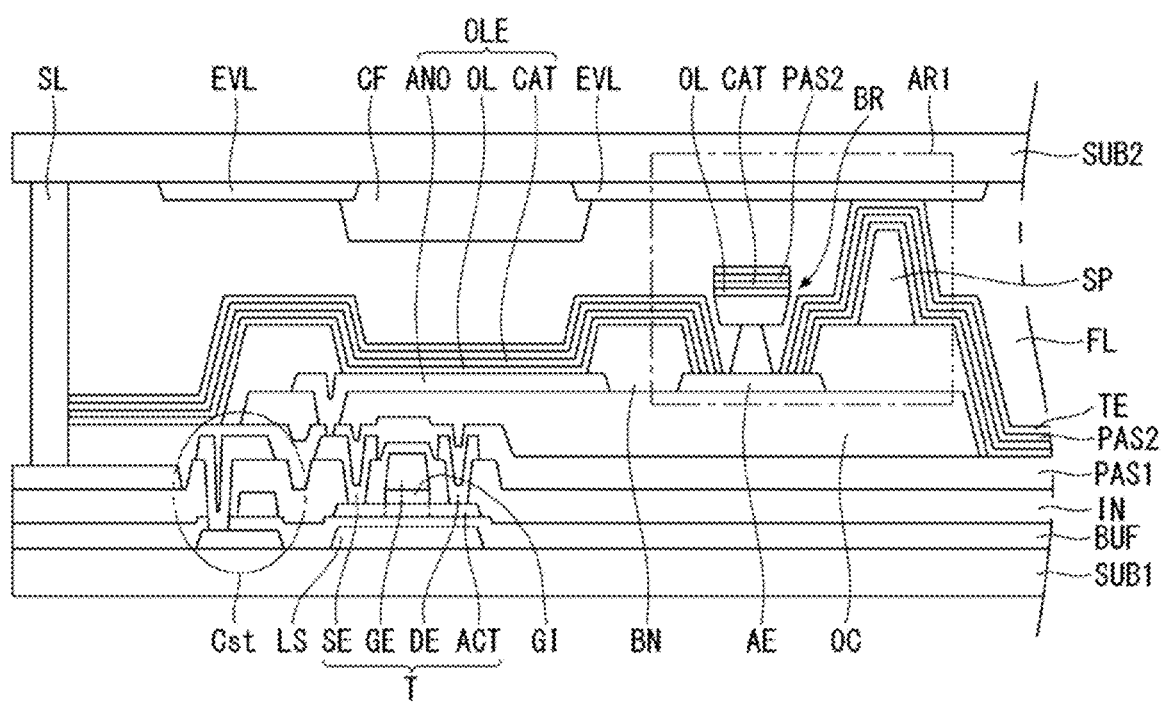
FIG. 3 is a cross-sectional view of an OLED display according to an embodiment of the disclosure.
Figure 4:
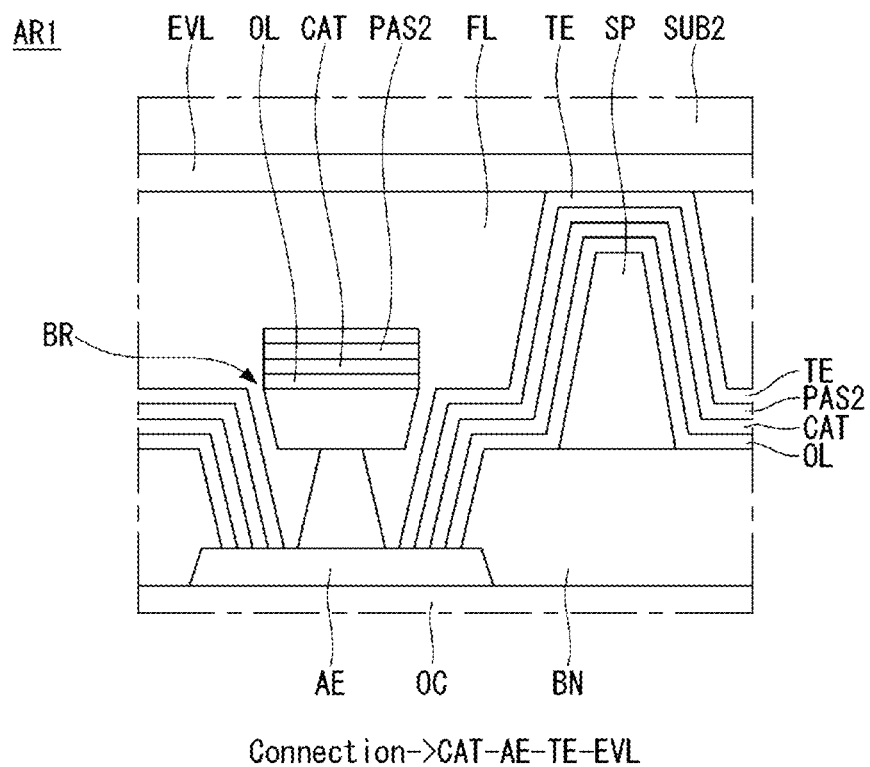
FIG. 4 is an enlarged view of an area AR1 shown in FIG. 3.

FIG. 3 is a cross-sectional view of an OLED display according to an embodiment of the present disclosure. FIG.

Figure 5:
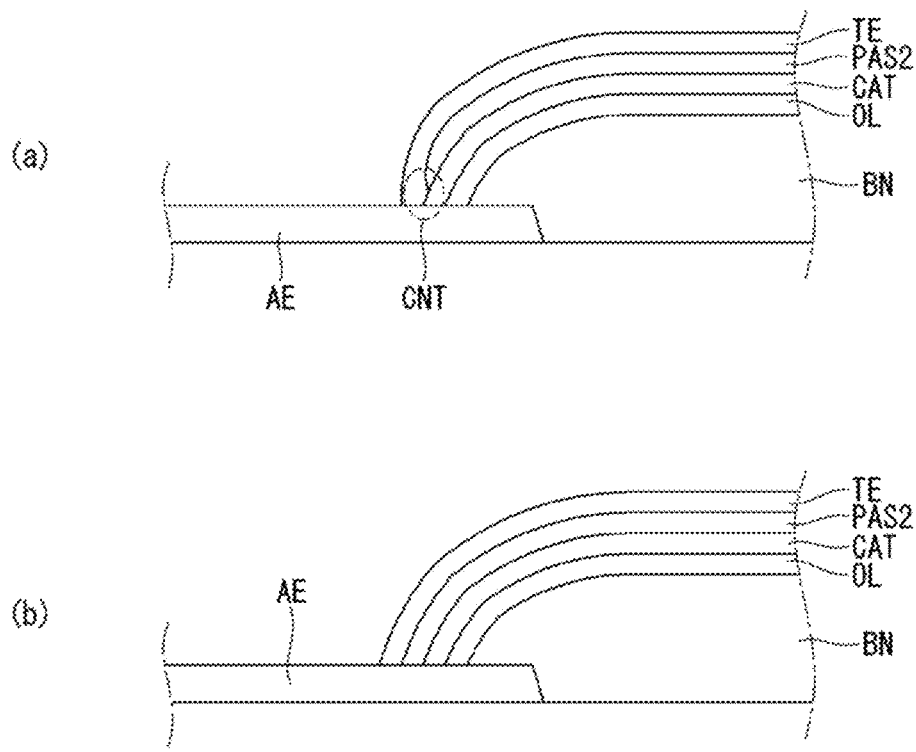
FIGS. 5 and 6 illustrate a position relationship and a connection relationship of a cathode, a protective layer, and a contact electrode according to an example of the disclosure.
Figure 6:
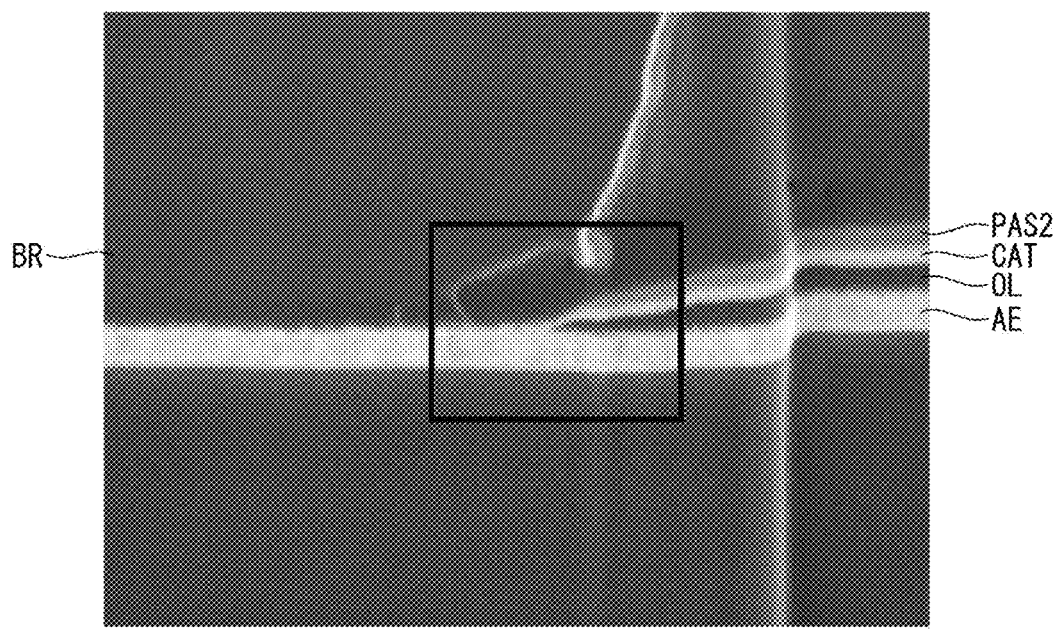

4 is an enlarged view of an area AR1 shown in FIG. 3. FIGS. 5 and 6 illustrate a position relationship and a connection relationship of a cathode, a protective layer, and a contact electrode according to an example of the present disclosure.

Referring to FIG. 3, the OLED display according to the embodiment of the disclosure includes a display panel including a first substrate SUB1 and a second substrate SUB2 facing each other. A filler layer FL can be interposed between the first substrate SUB1 and the second substrate SUB2.

The first substrate SUB1 is a thin film transistor array substrate on which a thin film transistor T and an organic light emitting diode OLE are disposed. The second substrate SUB2 is a substrate on which a low potential power voltage line (hereinafter referred to as "Evss line") EVL is disposed. The second substrate SUB2 can function as an encapsulation substrate. The first substrate SUB1 and the second substrate SUB2 can be attached to each other using a sealant SL. The sealant SL is disposed at an edge of the first substrate SUB1 and an edge of the second substrate SUB2 and maintains a predetermined distance between the first substrate SUB1 and the second substrate SUB2. The filler layer FL can be disposed (or be accommodated) inside the sealant SL.

The first substrate SUB1 can be made of glass material or plastic material. For example, the first substrate SUB1 can be made of plastic material such as polyimide (PI), polyethylene terephthalate (PET), polyethylene naphthalate (PEN), and polycarbonate (PC) and can have flexible characteristics.

The thin film transistor T and the organic light emitting diode OLE connected to the thin film transistor T are formed on the first substrate SUB1. A light shielding layer LS and a buffer layer BUF can be formed between the first substrate SUB1 and the thin film transistor T. The light shielding layer LS is disposed to overlap a semiconductor layer, particularly, a channel of the thin film transistor T and can protect an oxide semiconductor element from external light. The buffer layer BUF can block ions or impurities diffused from the first substrate SUB1 and also block moisture penetration from the outside.

The thin film transistor T includes a semiconductor layer ACT, a gate electrode GE, a source electrode SE, and a drain electrode DE.

A gate insulating layer GI and the gate electrode GE are disposed on the semiconductor layer ACT. The gate insulating layer GI functions to insulate the gate electrode GE and can be formed of silicon oxide (SiOx). However, embodiments are not limited thereto. The gate electrode GE is disposed to overlap the semiconductor layer ACT with the gate insulating layer GI interposed therebetween. The gate electrode GE can be formed as a single layer or a multilayer using copper (Cu), molybdenum (Mo), aluminum (Al), chrome (Cr), gold (Au), titanium (Ti), nickel (Ni), neodymium (Nd), tantalum (Ta), tungsten (W), or a combination thereof. The gate insulating layer GI and the gate electrode GE can be patterned using the same mask. In this instance, the gate insulating layer GI and the gate electrode GE can have the same area. The gate insulating layer GI can be formed to cover the entire surface of the first substrate SUB1.

An interlayer dielectric layer IN is positioned on the gate electrode GE. The interlayer dielectric layer IN functions to insulate the gate electrode GE and the source and drain electrodes SE and DE from each other. The interlayer dielectric layer IN can be formed of silicon oxide (SiOx), silicon nitride (SiNx), or a multilayer thereof. However, embodiments are not limited thereto.

The source electrode SE and the drain electrode DE are positioned on the interlayer dielectric layer IN. The source electrode SE and the drain electrode DE are spaced from each other by a predetermined distance. The source electrode SE contacts one side of the semiconductor layer ACT through a source contact hole penetrating the interlayer dielectric layer IN. The drain electrode DE contacts the other side of the semiconductor layer ACT through a drain contact hole penetrating the interlayer dielectric layer IN.

Each of the source electrode SE and the drain electrode DE can be formed as a single layer or as a multilayer. When each of the source electrode SE and the drain electrode DE is formed as the single layer, each of the source electrode SE and the drain electrode DE can be formed of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE can be formed as a double layer of Mo/Al-Nd, Mo/Al, Ti/Al or Cu/MoTi, or as a triple layer of Mo/Al-Nd/Mo, Mo/Al/Mo, Ti/Al/Ti or MoTi/Cu/ MoTi.

A passivation layer PAS1 is positioned on the thin film transistor T. The passivation layer PAS1 protects the thin film transistor T and can be formed of silicon oxide (SiOx), silicon nitride (SiNx), or a multilayer thereof.

A planarization layer OC is positioned on the passivation layer PAS1. The planarization layer OC can reduce or planarize a height difference (or step coverage) of an underlying structure and can be formed of an organic material such as photo acryl, polyimide, benzocyclobutene-based resin, and acrylate-based resin. If necessary or desired, one of the passivation layer PAS1 and the planarization layer OC can be omitted.

The organic light emitting diode OLE and an auxiliary electrode AE are positioned on the planarization layer OC. The organic light emitting diode OLE includes an anode ANO, an organic light emitting layer OL, and a cathode CAT.

More specifically, the anode ANO is positioned on the planarization layer OC. The anode ANO is connected to the source electrode SE of the thin film transistor T through a contact hole penetrating the passivation layer PAS1 and the planarization layer OC. The anode ANO can include a reflective layer and thus serve as a reflective electrode. The reflective layer can be formed of aluminum (Al), copper (Cu), silver (Ag), palladium (Pd), nickel (Ni), or a combination thereof. For example, the reflective layer can be formed of Ag/Pd/Cu (APC) alloy. The anode ANO can be formed as a multilayer including a reflective layer.

The auxiliary electrode AE is positioned on the planarization layer OC. The auxiliary electrode AE can be formed of the same material as the anode ANO at the same layer as the anode ANO. In this instance, because a separate process for forming the auxiliary electrode AE does not need to be performed, the number of processes can be reduced. Hence, the manufacturing time and the manufacturing cost can be reduced, and product yield can be remarkably improved.

A bank layer BN is positioned on the first substrate SUB1, on which the anode ANO and the auxiliary electrode AE are formed, and partitions pixels. The bank layer BN can be formed of an organic material such as polyimide, benzocyclobutene-based resin, and acrylate. At least a portion of the anode ANO is exposed by a first opening of the bank layer BN. The portion of the anode ANO exposed by the first opening of the bank layer BN can be defined as an emission region.

The bank layer BN can be configured to expose the center portion of the anode ANO and cover an edge of the anode ANO. The exposed portion of the anode ANO can be designed to have as large an area as possible, in order to sufficiently secure an aperture ratio. Further, at least a portion of the auxiliary electrode AE is exposed by a second opening of the bank layer BN. The bank layer BN can be configured to expose a center portion of the auxiliary electrode AE and cover an edge of the auxiliary electrode AE.

A barrier BR is positioned on the first substrate SUB1 on which the bank layer BN is formed. The barrier BR is positioned on the auxiliary electrode AE. The barrier BR functions to physically divide each of the organic light emitting layer OL, the cathode CAT, and a protective layer PAS2 that will be formed later. In other words, each of the organic light emitting layer OL, the cathode CAT, and the protective layer PAS2 is disposed on the auxiliary electrode AE and is physically divided by the barrier BR. Hence, each of the organic light emitting layer OL, the cathode CAT, and the protective layer PAS2 can be discontinuously formed on the auxiliary electrode AE.

A spacer SP is positioned on the bank layer BN. The spacer SP can include a plurality of spacers SP, and the plurality of spacers SP can be selectively disposed at a predetermined location on the bank layer BN. The spacer SP can be disposed adjacent to an area having the auxiliary electrode AE and the barrier BR. The spacer SP has a shape protruding toward the second substrate SUB2. The bank layer BN and the spacer SP can be simultaneously formed through one mask process using a half-tone mask. However, embodiments are not limited thereto.

The bank layer BN and the planarization layer OC can be patterned to cover only the thin film transistor T and a storage capacitor Cst connected to the thin film transistor T inside the pixel. As shown in FIG. 3, the storage capacitor Cst can have a triple structure in which first to third capacitor electrodes are stacked. However, embodiments are not limited thereto and include other variations. For example, the storage capacitor Cst can be implemented as a plurality of layers.

The organic light emitting layer OL is positioned on the first substrate SUB1 on which the barrier BR and the spacer SP are formed. The organic light emitting layer OL can be widely formed on an entire surface of the first substrate SUB1. The organic light emitting layer OL is a layer, in which electrons and holes combine and emit light. The organic light emitting layer OL includes an emission layer EML and can further include one or more of a hole injection layer HIL, a hole transport layer HTL, an electron transport layer ETL, and an electron injection layer EIL. The emission layer EML can include a light emitting material that generates white light.

The organic light emitting layer OL emitting white light can have a multi-stack structure, for example, an n-stack structure, where n is an integer equal to or greater than 1. For example, 2-stack structure can include a charge generation layer CGL between the anode ANO and the cathode CAT and a first stack and a second stack respectively disposed on and under the charge generation layer CGL. Each of the first stack and the second stack includes an emission layer and can further include at least one common layer. The emission layer of the first stack and the emission layer of the second stack can include emission materials of different colors, respectively.

The organic light emitting layer OL on the auxiliary electrode AE is physically divided by the barrier BR. The organic light emitting layer OL is divided by the barrier BR and exposes at least a portion of the auxiliary electrode AE around the barrier BR. A portion of the organic light emitting layer OL divided by the barrier BR is positioned on the barrier BR.

The cathode CAT is positioned on the organic light emitting layer OL. The cathode CAT can be widely formed on the entire surface of the first substrate SUB1. The cathode CAT can be formed of a transparent conductive material such as indium tin oxide (ITO) and indium zinc oxide (IZO). Alternatively, the cathode CAT can be formed of a material, which is thin enough to transmit light, for example, magnesium (Mg), calcium (Ca), aluminum (Al), silver (Ag), or a combination thereof.

The cathode CAT on the auxiliary electrode AE is physically divided by the barrier BR. The cathode CAT is divided by the barrier BR and exposes at least a portion of the auxiliary electrode AE around the barrier BR. A portion of the cathode CAT divided by the barrier BR is positioned on the barrier BR. As will be described later, the cathode CAT can directly contact the auxiliary electrode AE and can be supplied with the low potential power voltage through the auxiliary electrode AE.

The cathode CAT covers the organic light emitting layer OL, and one end of the cathode CAT directly contacts the auxiliary electrode AE. Namely, one end of the cathode CAT, which is divided by the barrier BR and is exposed, directly contacts an exposed upper surface of the auxiliary electrode AE. Such a structure can be implemented by a step coverage difference between materials forming the organic light emitting layer OL and the cathode CAT. For example, because the cathode CAT is made of a transparent conductive material having better step coverage than a formation material of the organic light emitting layer OL, the cathode CAT can be configured to directly contact the auxiliary electrode AE. Furthermore, in order to implement the structure, the organic light emitting layer OL and the cathode CAT can be formed using different methods. For example, the organic light emitting layer OL can be formed using a thermal deposition method, and the cathode CAT can be formed using a sputtering method. Hence, one end of the divided cathode CAT can be extended further than one end of the divided organic light emitting layer OL and can directly contact the auxiliary electrode AE.

The protective layer PAS2 is positioned on the cathode CAT. The protective layer PAS2 can be widely formed on the entire surface of the first substrate SUB1. The protective layer PAS2 can be formed of a material such as silicon oxide (SiOx) and silicon nitride (SiNx).

More specifically, the protective layer PAS2 is positioned on the cathode CAT and can block the penetration of foreign material that can enter the organic light emitting diode OLE. For example, because the cathode CAT including a transparent conductive material is a crystalline component and cannot block the penetration of ions and moisture, external impurities can pass through the cathode CAT and can enter the organic light emitting layer OL. The embodiment of the disclosure further includes the protective layer PAS2 on the organic light emitting diode OLE and can block the penetration of foreign material that can enter the organic light emitting diode OLE. Hence, the embodiment of the disclosure can prevent a reduction in lifespan of the organic light emitting diode OLE and a luminance reduction.

In addition, the protective layer PAS2 is positioned on the cathode CAT and can buffer or mitigate a stress applied to the cathode CAT when the first substrate SUB1 and the second substrate SUB2 are attached to each other. For example, because the cathode CAT including the transparent conductive material has brittle characteristics, the cathode CAT can easily crack due to an external force applied. The embodiment of the disclosure further includes the protective layer PAS2 on the cathode CAT and can prevent a crack from being generated in the cathode CAT. Furthermore, the embodiment of the disclosure can prevent the penetration of oxygen or moisture through the crack.

The protective layer PAS2 on the auxiliary electrode AE is physically divided by the barrier BR. The protective layer PAS2 is divided by the barrier BR and exposes at least a portion of the auxiliary electrode AE around the barrier BR. A portion of the protective layer PAS2 divided by the barrier BR is positioned on the barrier BR. Hence, the portion of the organic light emitting layer OL, the portion of the cathode CAT, and the portion of the protective layer PAS2, each of which is divided by the barrier BR, are sequentially stacked on the barrier BR.

A contact electrode TE is positioned on the protective layer PAS2. The contact electrode TE can be widely formed on the entire surface of the first substrate SUB1. The contact electrode TE can be formed of a transparent conductive material such as indium tin oxide (ITO) and indium zinc oxide (IZO). Alternatively, the contact electrode TE can be formed of a material which is thin enough to transmit light, for example, magnesium (Mg), calcium (Ca), aluminum (Al), silver (Ag), or a combination thereof.

The contact electrode TE on the auxiliary electrode AE is physically divided by the barrier BR. The contact electrode TE is divided by the barrier BR and exposes at least a portion of the auxiliary electrode AE around the barrier BR. A portion of the contact electrode TE divided by the barrier BR is positioned on the barrier BR.

The contact electrode TE covers the protective layer PAS2, and one end of the contact electrode TE directly contacts the auxiliary electrode AE. Namely, one end of the contact electrode TE, which is divided by the barrier BR and is exposed, directly contacts an exposed upper surface of the auxiliary electrode AE. Hence, the cathode CAT, the auxiliary electrode AE, and the contact electrode TE are electrically connected.

Referring to (a) of FIG. 5 and FIG. 6, the contact electrode TE protrudes more toward the barrier BR than the protective layer PAS2 and directly contacts the auxiliary electrode AE. In this instance, one end of the contact electrode TE and one end of the cathode CAT can directly contact each other. Namely, the protective layer PAS2 can be formed on the cathode CAT to expose at least an end of the cathode CAT, and the exposed end of the cathode CAT can directly contact the contact electrode TE in one region CNT. Hence, the contact electrode TE can directly contact each of the auxiliary electrode AE and the cathode CAT.

Referring to (b) of FIG. 5 as another example, the protective layer PAS2 can be configured to completely cover the cathode CAT. Namely, the protective layer PAS2 can be configured so that one end directly contacts the auxiliary electrode AE, and can completely cover the cathode CAT. The embodiment of the disclosure can efficiently block the penetration of foreign material that can enter the organic light emitting diode OLE by forming the protective layer PAS2 to completely cover the cathode CAT. In this instance, the cathode CAT and the contact electrode TE are physically spaced apart from each other with the protective layer PAS2 interposed therebetween.

The structures illustrated in FIG. 5 can be implemented by properly controlling process conditions. For example, the cathode CAT and the contact electrode TE can be formed using a mask including openings having the same material and the same area, and in this instance, the structures illustrated in FIG. 5 can be selectively implemented by selectively adjusting process parameters such as power and pressure.

The Evss line EVL and a color filter CF are formed on the second substrate SUB2 attached to the first substrate SUB1. A stacking order of the Evss line EVL and the color filter CF on the second substrate SUB2 can be changed. For example, the color filter CF can be formed after the Evss line EVL is formed, or the Evss line EVL can be formed after the color filter CF is formed. If necessary or desired, the color filter CF can be formed on the first substrate SUB1.

The Evss line EVL includes a low resistance conductive material. For example, the Evss line EVL can be formed of molybdenum (Mo), aluminum (Al), chromium (Cr), gold (Au), titanium (Ti), nickel (Ni), neodymium (Nd), copper (Cu), or a combination thereof.

The Evss line EVL can include a low reflective conductive material. For example, the Evss line EVL is formed of the low reflective conductive material and thus can prevent visibility from being reduced by the reflection of external light. Thus, a display device according to embodiments of the disclosure does not need to include a separate component for shielding (or absorbing) light incident from outside, like a polarizing film.

The Evss line EVL can function as a black matrix. Therefore, the Evss line EVL can prevent a defect of color mixture from occurring between neighboring pixels. The Evss line EVL is disposed corresponding to a non-emission region so as to expose at least the emission region. Further, the embodiment of the disclosure can use the Evss line EVL as the black matrix and thus does not need to additionally perform a separate process for forming the black matrix. Therefore, the embodiment of the disclosure can further reduce the number of processes compared to a related art structure, and thus can reduce the manufacturing time and the manufacturing cost and remarkably improve product yield.

The color filter CF can include red (R), blue (B), and green (G) color filters. The pixel can include subpixels emitting red, blue, and green light, and the color filters CF can be respectively assigned to the corresponding subpixels. The red, blue, and green color filters CF can be partitioned by the Evss line EVL. If necessary or desired, the pixel can further include a white (W) subpixel.

The completed first and second substrates SUB1 and SUB2 are attached to each other with the filler layer FL interposed therebetween. As the contact electrode TE on the first substrate SUB1 and the Evss line EVL on the second substrate SUB2 directly contact each other upon the attachment, the cathode CAT, the auxiliary electrode AE, the contact electrode TE, and the Evss line EVL of a low resistance are electrically connected. Hence, the cathode CAT, the auxiliary electrode AE, the contact electrode TE, and the Evss line EVL of the low resistance can form a power supply path through which a low potential power voltage is applied.

The embodiments of the disclosure can reduce a voltage variation (or voltage deviation) depending on a position by connecting the Evss line EVL formed of the low resistance conductive material to the cathode CAT, thereby minimizing non-uniformity of luminance. Furthermore, the embodiments of the disclosure do not need to separately assign an area for forming the Evss line EVL and an area for connecting the Evss line EVL and the cathode CAT to the thin film transistor array substrate, as in the related art. Thus, the embodiments of the disclosure can be easily applied to a high-resolution display having a high pixel per inch (PPI) and can remarkably improve a degree of design freedom.

Figure 7:
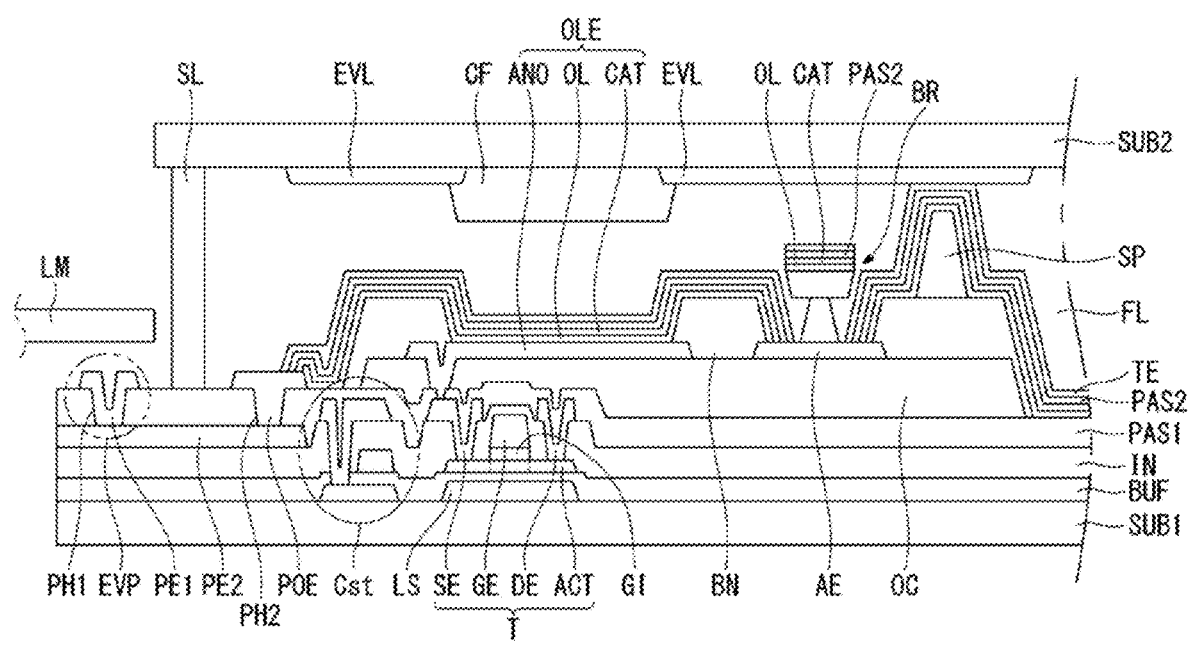
FIG. 7 illustrates an example of configuration of a power supply unit according to an example of the disclosure.

A power supply path of a low potential power voltage generated from a power generating part is described in detail below. FIG. 7 illustrates an example of configuration of a power supply unit according to an embodiment of the present disclosure.

Referring to FIG. 7, an OLED display according to the embodiment of the disclosure further includes a connection member LM attached to at least one side of a display panel, particularly, at least one side of a first substrate SUB1. The connection member LM can be a chip-on film (COF). However, embodiments are not limited thereto and include other variations.

The first substrate SUB1 includes a low potential power voltage pad (hereinafter referred to as "Evss pad") EVP and a power electrode POE. The Evss pad EVP is disposed outside the sealant SL and is electrically connected to the connection member LM. The power electrode POE is disposed inside the sealant SL and is exposed to an upper surface of the first substrate SUB1 on which several elements are disposed.

The Evss pad EVP receives a low potential power voltage generated from a power generating part through the connection member LM and transfers the low potential power voltage to the power electrode POE. The power electrode POE can directly contact a cathode CAT and/or a contact electrode TE and thus can supply the low potential power voltage to the cathode CAT and/or the contact electrode TE. Hence, the connection member LM, the Evss pad EVP, the power electrode POE, and the cathode CAT can be electrically connected to form a low potential power voltage supply path, and/or the connection member LM, the Evss pad EVP, the power electrode POE, and the contact electrode TE can be electrically connected to form a low potential power voltage supply path.

More specifically, the Evss pad EVP includes at least one pad electrode. When a plurality of pad electrodes is used, the pad electrodes can be disposed at different layers with at least one insulating layer interposed therebetween and can be electrically connected through a pad contact hole penetrating the at least one insulating layer. For example, as shown in FIG. 7, the Evss pad EVP can include a first pad electrode PE1 and a second pad electrode PE2 that are disposed at different layers with a passivation layer PAS1 interposed therebetween, and the first pad electrode PE1 and the second pad electrode PE2 can be connected to each other through a first pad contact hole PH1 penetrating the passivation layer PAS1. Hereinafter, the embodiment of the disclosure describes a case where the Evss pad EVP includes the first pad electrode PE1 and the second pad electrode PE2 as an example, for convenience of explanation.

The first pad electrode PE1 can be disposed outside the sealant SL and is exposed to the outside. The exposed first pad electrode PE1 can be attached to the connection member LM. The first pad electrode PE1 and the connection member LM can be attached to each other through an anisotropic conductive film (ACF) layer interposed between them.

The second pad electrode PE2 is extended to the inside of the sealant SL and is electrically connected to the power electrode POE. In this instance, the second pad electrode PE2 can contact the power electrode POE through a second pad contact hole PH2 penetrating the passivation layer PAS1. FIG. 7 illustrates that the second pad electrode PE2 and the power electrode POE are disposed with only the passivation layer PAS1 interposed therebetween, by way of example. However, embodiments are not limited thereto. For example, the second pad electrode PE2 and the power electrode POE can be disposed at different layers with the passivation layer PAS1 and a planarization layer OC interposed therebetween and can be electrically connected to each other through a contact hole penetrating the passivation layer PAS1 and the planarization layer OC.

The power electrode POE can be formed together when the anode ANO is formed. Namely, the power electrode POE can be formed of the same material as the anode ANO and the auxiliary electrode AE. However, embodiments are not limited thereto.

At least a portion of the power electrode POE can be exposed and can directly contact the cathode CAT and/or the contact electrode TE. In order to expose at least a portion of the power electrode POE, respective areas of layers widely formed on the entire surface of the first substrate SUB1 can be controlled. The layers, of which the area is controllable, can be layers (i.e., an organic light emitting layer OL, the cathode CAT, a protective layer PAS2, and the contact electrode TE) formed after the formation of the power electrode POE.

More specifically, the above layers are formed using a frame-shaped open mask having an opening. An area of the opening of the open mask can correspond to an area occupied by the above layers on the first substrate SUB1. Thus, at least a portion of the power electrode POE can be exposed by controlling the area of the opening of the open mask, and the cathode CAT and/or the contact electrode TE can directly contact the power electrode POE. Hence, the connection member LM, the Evss pad EVP, the power electrode POE, and the cathode CAT can be electrically connected to form a low potential power voltage supply path, and/or the connection member LM, the Evss pad EVP, the power electrode POE, and the contact electrode TE can be electrically connected to form a low potential power voltage supply path.

Although the embodiments have been described with reference to a number of illustrative embodiments thereof, numerous other modifications and embodiments can be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
   a first substrate on which an organic light emitting diode is disposed; and
   a second substrate on which a power line supplied with a power voltage is disposed, the second substrate facing the first substrate,
   wherein the first substrate includes:
     an auxiliary electrode;
     a bank having an opening exposing at least a portion of the auxiliary electrode;
     a barrier disposed on the exposed auxiliary electrode;
     a spacer disposed on the bank and protruding toward the second substrate;
     a cathode included in the organic light emitting diode and divided by the barrier, one end of the cathode directly contacting the auxiliary electrode;

a contact electrode disposed on the cathode and divided by the barrier, one end of the contact electrode directly contacting the auxiliary electrode; and a protective layer interposed between the cathode and the contact electrode, wherein the contact electrode and the power line directly contact each other.

2. The organic light emitting diode display of claim 1, wherein the protective layer disposed on the cathode exposes at least a portion of one end of the cathode, and wherein the contact electrode directly contacts the exposed portion of the cathode.

3. The organic light emitting diode display of claim 1, wherein the cathode and the contact electrode are physically spaced apart from each other with the protective layer interposed therebetween.

4. The organic light emitting diode display of claim 1, further comprising a power electrode disposed on the first substrate and configured to receive the power voltage from a power generating part, wherein the cathode directly contacts at least a portion of the power electrode.

5. The organic light emitting diode display of claim 4, wherein the contact electrode directly contacts at least a portion of the power electrode.

6. The organic light emitting diode display of claim 1, wherein the second substrate includes color filters, and wherein the color filters are partitioned by the power line.

7. The organic light emitting diode display of claim 1, wherein each of the first substrate and the second substrate includes an emission region, to which light from the organic light emitting diode is emitted, and a non-emission region outside the emission region, and wherein the power line is disposed on the non-emission region.

8. The organic light emitting diode display of claim 1, further comprising a filler layer interposed between the first substrate and the second substrate.

* * * * *